United States Patent [19]
Uomi et al.

[11] Patent Number: 4,811,354
[45] Date of Patent: Mar. 7, 1989

[54] SEMICONDUCTOR LASER

[75] Inventors: Kazuhisa Uomi, Kokubunji; Naoki Chinone, Hachioji; Misuzu Yoshizawa, Tokyo; Shin'ichi Nakatsuka, Kokubunji; Takashi Kajimura; Yuichi Ono, both of Tokyo, all of Japan

[73] Assignee: Hitachi, Ltd., Tokyo, Japan

[21] Appl. No.: 895,843

[22] Filed: Aug. 12, 1986

[30] Foreign Application Priority Data

Sep. 4, 1985 [JP] Japan .............................. 60-193740
Sep. 13, 1985 [JP] Japan .............................. 60-201545

[51] Int. Cl.$^4$ .............................................. H01S 3/19
[52] U.S. Cl. ........................................ 372/46; 372/45; 372/50
[58] Field of Search ..................... 372/45, 46, 44, 50, 372/47

[56] References Cited

U.S. PATENT DOCUMENTS

| | | | |
|---|---|---|---|
| 4,369,513 | 1/1983 | Umeder et al. | 372/50 |
| 4,641,311 | 2/1987 | Ackley | 372/50 |
| 4,674,096 | 6/1987 | Salzman et al. | 372/50 |
| 4,706,255 | 11/1987 | Thornton et al. | 372/45 |

FOREIGN PATENT DOCUMENTS 0111294 8/1979 Japan .................................. 372/46

OTHER PUBLICATIONS

Kapon et al., "Supermode Analysis of Phase-Locked Array of Semiconductor Lasers," Optics Letters, vol. 10, No. 4, Apr. 1984, pp. 125-127.

Primary Examiner—William L. Sikes
Assistant Examiner—Georgia Y. Epps
Attorney, Agent, or Firm—Antonelli, Terry & Wands

[57] ABSTRACT

A phased array semiconductor laser has two or more luminous stripes. The number, width or center to center spacing of stripes is made different between the center region and neighborhood of facets of the laser so that the laser may oscillate stably in the fundamental supermode with an optical output of 100 mW or more.

30 Claims, 9 Drawing Sheets

FIG. 2a
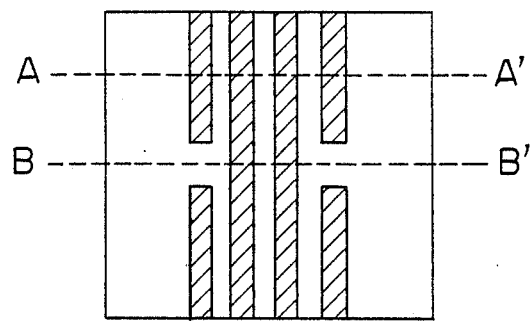
FIG. 2b
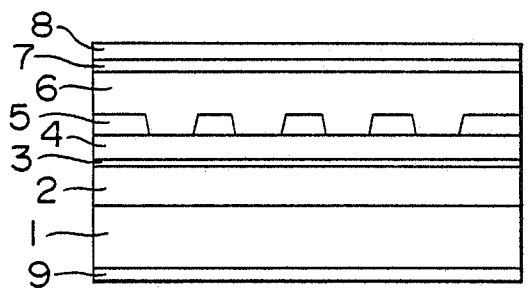
FIG. 2c
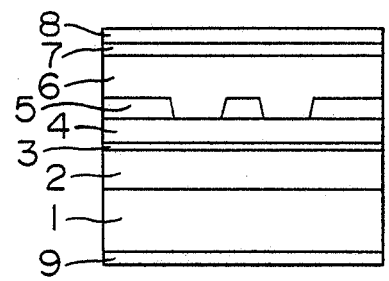
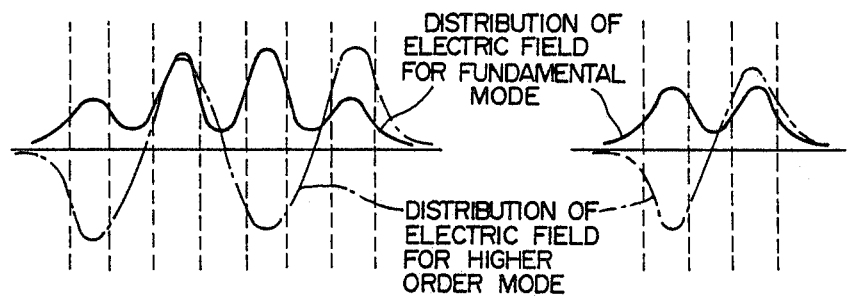
FIG. 2d            FIG. 2e F I G. 10
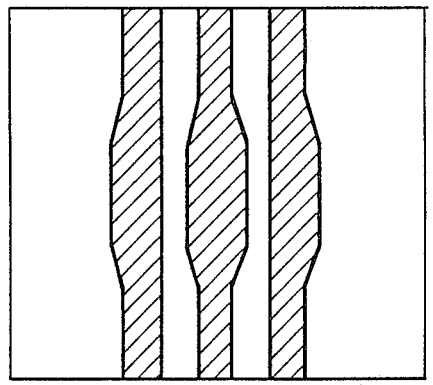
F I G. 11
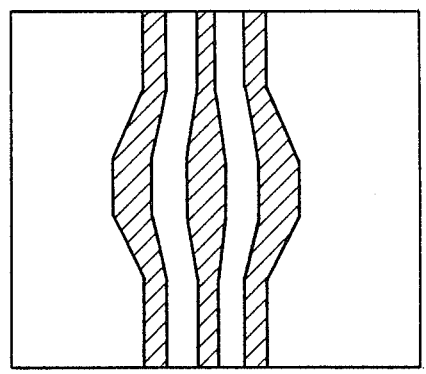

SEMICONDUCTOR LASER

BACKGROUND OF THE INVENTION

This invention relates to a high output semiconductor laser having a single lobe output beam and an optical output of 100 mW or more.

As a candidate for a realizable semiconductor laser of 100 mW or more optical output, there is available a so-called phased array type semiconductor laser having a plurality of luminous stripes which may be brought into mutual optical coupling. In this type of semiconductor laser, however, a higher order supermode tends to oscillate and hence the output beam becomes a two-lobe beam, resulting in inconveniences to practical applications.

The concept of the supermode is described in Optics Letters, page 125, April, 1984. The reason why the higher order supermode is selected in the aforementioned type of semiconductor laser will be explained with reference to FIG. 1. In the conventional phased array type laser, refractive index is related to gain (or loss) as graphically illustrated in FIG. 1. It will be seen from FIG. 1 that the gain is predominant in regions of larger refractive index while a large loss is predominant in regions of smaller refractive index. There are also depicted in FIG. 1 an electric field distribution for a fundamental supermode and an electric field distribution for a higher order supermode under the above conditions. In the regions of the large loss, the amplitude of the fundamental supermode is not null while the amplitude of the higher order supermode is null. Namely, optical loss of the higher order supermode is smaller than that of the fundamental supermode and consequently, the higher order supermode is subject to a lower threshold gain than the fundamental supermode. For the above reason, the higher order supermode oscillates in the conventional laser to produce a two-lobe output beam.

SUMMARY OF THE INVENTION

An object of this invention is to provide a highly reliable semiconductor laser which can produce a single lobe high output beam.

With the aim of selecting the fundamental supermode, the present inventors have contrived to control the electric field distribution by providing a structural expedient along a direction in which a laser beam propagates (longitudinal direction of stripes). To detail the above with reference to the drawings, reference should first be made to FIG. 2a which is a top view of a semiconductor laser according to an embodiment of the invention, FIG. 2b which shows a sectional view taken on the line A-A' of FIG. 2a and an electric field distribution of a supermode along the section line, and FIG. 2c which shows a sectional view taken on the line B-B' of FIG. 2a and an electric field distribution of the supermode along the section line. As best seen from FIG. 2a, the number of stripes is four in almost the entire region including the mirror facets of the laser but it is two in the center region of the laser. Considering first a fundamental supermode, its electric field distribution has, in the four-stripe region, a large amplitude at the central two stripes and a small amplitude at the opposite side stripes. As the fundamental supermode propagates to enter the two-stripe region, its electric field distribution is readily converted into a smoothed one as shown in FIG. 2c. Considering a higher order supermode, on the other hand, its electric field distribution has, in the four-stripe region, substantially the same amplitude at each stripe. As the higher order supermode propagates to enter the two-stripe region, its electric field distribution faces difficulties in being converted into one shown in FIG. 2c because the ratio of electric field outside the phased array stripes per entire electric field is rather large. In other words, it is difficult for the higher order supermode to pass through the two-stripe region. Thus, the higher order supermode is reflected at the boundary between the four-stripe region and two-stripe region. Consequently, the threshold gain for the higher order supermode is increased and the fundamental supermode can be selected. Although the invention has been described so far by referring, for simplicity of explanation, to an instance that the number of the stripes is four in one region and two in the other region, the number of the stripes is not essential and the same effect as above can be attained by providing, along the longitudinal direction of stripes, a region in which the number of stripes changes.

The fundamental supermode may also be selected in another way as will be described with reference to FIG. 7a which is a top view of a semiconductor laser according to another embodiment of the invention and FIG. 7b which is a sectional view taken on the line A-A' of FIG. 7a. In these figures, the number of stripes is intact in the longitudinal direction of stripes but the width of a stripe and the spacing or pitch between adjacent stripes are changed along the stripe direction in such a manner that the whole width across all the stripes (hereafter simply referred to as the whole stripe width) is narrowed in the center region of the laser. The whole stripe width in the center region is designed to be about 5 $\mu$m or less so that the higher order mode may all be cut off. As a result, the higher order supermode can not pass through the region of the narrow whole stripe width and only the fundamental transverse mode is allowed to oscillate. In other words, the higher order supermode is permitted to exist in the laser facet region having the wider whole stripe width but is not allowed to pass through the center region, thus failing to oscillate. It is also possible to select the fundamental supermode even if the whole stripe width in the center region is not so narrow that cut-off of the higher order mode occurs. This is because the difference in profile of electric fields in the two regions having the different whole stripe widths becomes as large as the higher order mode and consequently, effective reflection occurs at the boundary between the two regions. For simplicity of explanation, the number of the stripes is three in an instance of FIGS. 7a and 7b but according to the invention, the number of stripe is in no way limitative.

Advantageously, the present invention permits production of a phased array type semiconductor laser which can produce a single number of output beam, i.e., a single lobe output beam, thereby realizing a high output semiconductor laser of 100 mW or more optical output which is stable in transverse mode.

BRIEF DESCRIPTION OF THE DRAWINGS

FIGS. 2a to 2c, FIGS. 3a to 3c, FIGS. 4a to 4c, FIGS. 5a to 5c, FIG. 6, FIGS. 7a and 7b, FIGS. 8a and 8b, FIGS. 9a and 9b, FIG. 10 and FIG. 11 show different embodiments of the invention.

FIGS. 2d and 2e show electric field distributions for the devices shown in FIGS. 2b and 2c, respectively, wherein the solid line indicates distribution of the fundamental mode and the broken line indicates distribution of higher order modes.

DESCRIPTION OF THE PREFERRED EMBODIMENTS

Embodiment 1

Figure 1:
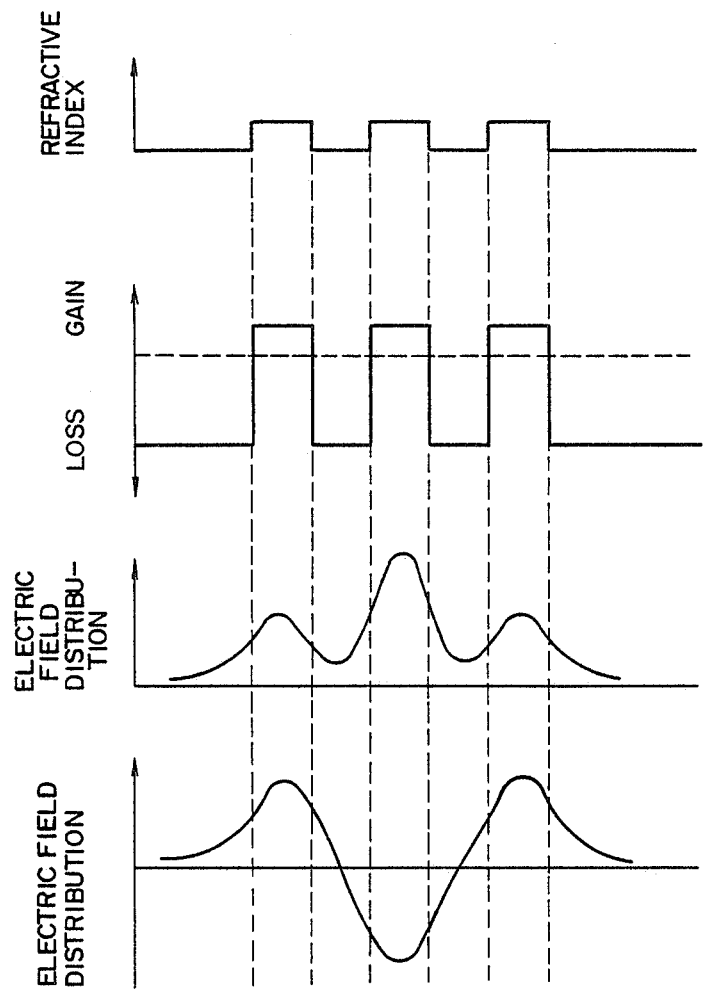
FIG. 1 shows waveforms useful to explain a supermode in a conventional phased array laser.

When the invention is applied to a GaAlAs system semiconductor laser, a resulting laser has a top view as shown in FIG. 2a with sectioned on the line A-A' of FIG. 2a as shown in FIG. 2b and sectioned on the line B-B' of FIG. 2a as shown in FIG. 2c.

A cladding layer 2 of n-$Ga_{0.5}Al_{0.5}As$, an undoped active layer 3 of $Ga_{0.86}Al_{0.14}As$, a cladding layer 4 of p-$Ga_{0.5}Al_{0.5}As$ and a current-blocking layer 5 of n-GaAs were successively grown through MOCVD process on a crystalline substrate 1 of n-GaAs. The overall depth of part of the n-GaAs layer 5 was removed by photoetching to form grooved stripes of 4 $\mu$m width which exposed corresponding surface portions of the p-$Ga_{0.5}Al_{0.5}As$ cladding layer 4, the number of the grooved stripes being four at near the mirror facets and two in the center region of the laser as best seen from FIG. 2a. In this embodiment, the spacing between adjacent stripes (center to center pitch) was 6 $\mu$m and the length (longitudinal) of the two-stripe region was 50 $\mu$m. Subsequently, a cladding layer 6 of p-$Ga_{0.5}Al_{0.5}As$ and a cap layer 7 of p-GaAs were successively formed through MOCVD process. Thereafter, a positive electrode 8 and a negative electrode 9 were formed and then a laser device having a length of resonator of about 300 $\mu$m was prepared by cleaving. The thickness of the p-$Ga_{0.5}Al_{0.5}As$ cladding layer 4 was 0.1 to 0.5 $\mu$m and under this condition, the device became an index-guided waveguide which realized a phased array laser of low astigmatism and high output.

For a wavelength of 780 nm, the fabricated semiconductor laser was able to continuously oscillate with a threshold current of 100 to 120 mA at room temperature and to exhibit an oscillation spectrum of single longitudinal mode, having a far-field pattern of single lobe and a half width of 1.5°×25°. Namely, this structure was able to oscillate only in a fundamental supermode and to provide a stable transverse mode even with a maximum optical output of 300 mW. In addition, at 50° C., this laser was operated with a constant optical output of 300 mW for 2000 hours without remarkable degradation to evidence its long life and high reliability.

Embodiment 2

Figure 3A:
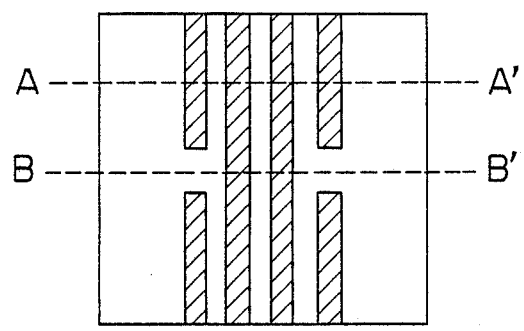
Figure 3B:
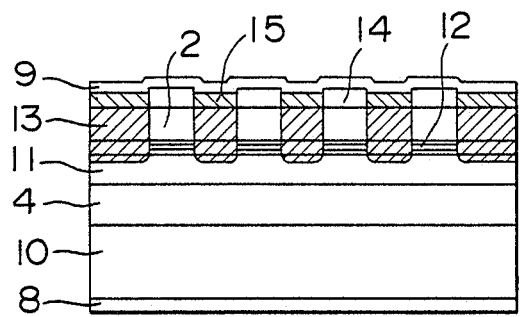
Figure 3C:
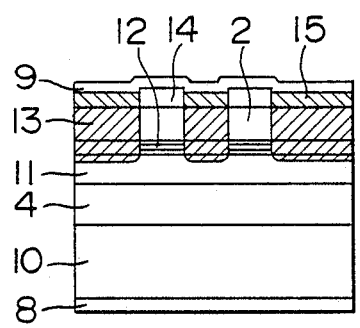

Another embodiment of the invention directed to a different type from the embodiment 1 will now be described with reference to FIG. 3a which is a top view of a laser according to this embodiment, FIG. 3b which is a sectional view taken on the line A-A' of FIG. 3a and FIG. 3c which is a sectional view taken on the line B-B' of FIG. 3a.

A cladding layer 4 of p-$Ga_{0.5}Al_{0.5}As$, an optical guide layer 11 of p-$Ga_{0.6}Al_{0.4}As$, a multiquantum well layer 12 in the form of a super lattice structure having alternate lamination of five 70 Å thick $Ga_{0.9}Al_{0.08}As$ well layers and five 40 Å thick $Ga_{0.72}Al_{0.28}As$ barrier layers, a cladding layer 2 of n-$Ga_{0.5}Al_{0.5}As$, and a cap layer 14 of n-GaAs were successively grown on a substrate 10 of p-GaAs through MOCVD process. Subsequently, the n-GaAs cap layer 14 was patterned through photoetching process to form four 5 $\mu$m width stripes near the mirror facets and two 5 $\mu$m width stripes in the center region of the laser and the remaining portions of the cap layer 14 were subjected to ion implantation of Si reaching the well layer 12, thereby forming disordered and alloyed layers 13. In this embodiment, the length of the two-stripe region was 80 $\mu$m and the center to center spacing between adjacent stripes was 8 $\mu$m. Thereafter, an $SiO_2$ film 15 was deposited on the n-GaAs cap layer 14 excepting the stripe pattern and then a positive electrode 8 and a negative electrode 9 were formed. Finally, a laser device having a length of resonator of about 300 $\mu$m was prepared by cleaving. The thus fabricated semiconductor laser was able to exhibit substantially the same characteristics as those of the embodiment 1 and to oscillate only in a fundamental supermode.

Embodiment 3

Figure 4A:
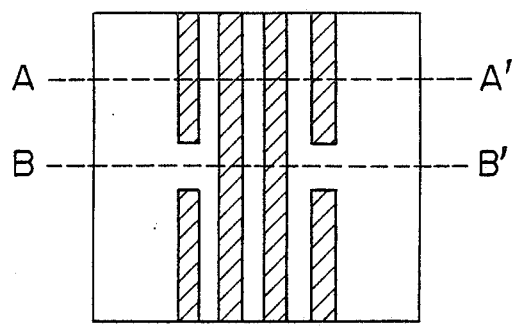
Figure 4B:
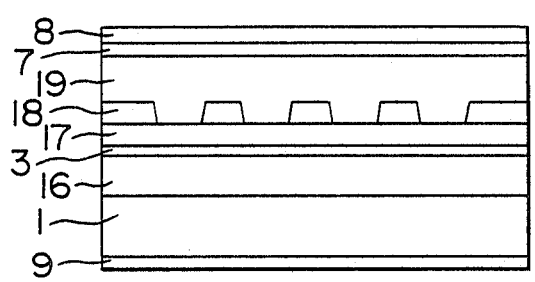
Figure 4C:
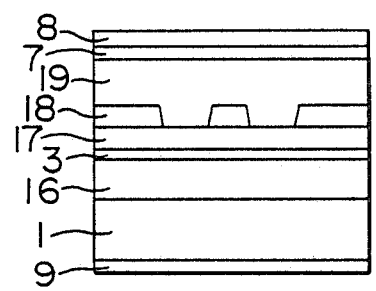

FIG. 4a is a top view of still another embodiment of the invention, FIG. 4b is a sectional view taken on the line A-A' of FIG. 4a and FIG. 4c is a sectional view taken on the line B-B' of FIG. 4a.

A cladding layer 16 of n-$Ga_{0.45}Al_{0.55}As$, an undoped active layer 3 of $Ga_{0.86}Al_{0.14}As$, a cladding layer 17 of p-$Ga_{0.55}Al_{0.45}As$ and a current-blocking layer 18 of n-$Ga_{0.45}Al_{0.55}$ were successively grown on a cystalline substrate 1 of n-GaAs through MOCVD process. The overall depth of part of the n-$Ga_{0.45}Al_{0.45}As$ layer 18 was removed by photoetching to form grooved stripes of 3 $\mu$m width which exposed corresponding surface of the p-$Ga_{0.55}Al_{0.45}As$ cladding layer 17, the number of the grooved stripes being four near the mirror facets and two in the center region of the laser as shown in FIG. 4a. In this embodiment, the center to center pitch between adjacent stripes was 6 $\mu$m and the length of the two-stripe region was 50 $\mu$m. Subsequently, a cladding layer 19 of p-$Ga_{0.55}Al_{0.45}As$ and a cap layer 7 of p-GaAs were successively formed through MOCVD process. Thereafter, a positive electrode 8 and a negative electrode 9 were formed and then a laser device having a length of resonator of about 300 $\mu$m was prepared by cleaving. The thickness of the p-$Ga_{0.55}Al_{0.45}As$ cladding layer 17 was 0.1 to 0.5 $\mu$m and under this condition, the device became an indexguided waveguide which realized a phased array laser of low astigmatism and high output.

For a wavelength of 780 nm, the fabricated semiconductor laser was able to continuously oscillate with a threshold current of 80 to 110 mA at room temperature and to exhibit an oscillation spectrum of single longitudinal mode, having a far-field pattern of single lobe and a half width of 2.0°×25°. Thus, this structure was able to oscillate only in a fundamental supermode and to provide a stable transverse mode even with a maximum optical output of 300 mW. In addition, at 50° C., this laser was operated with a constant optical output of 300 mW for 2000 hours without remarkable degradation to evidence its long life and high reliability.

Embodiment 4

Figure 5A:
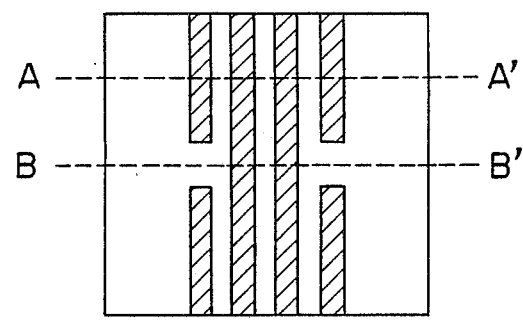
Figure 5B:
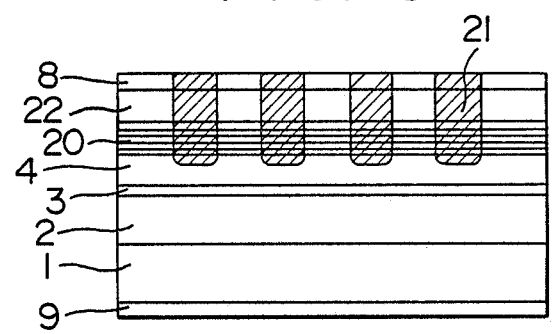
Figure 5C:
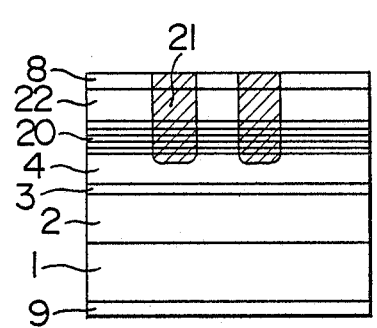

FIG. 5a shows still another embodiment of the invention, FIG. 5b is a sectional view taken on the line A-A' of FIG. 5a and FIG. 5c is a sectional view taken on the line B-B' of FIG. 5a.

A cladding layer 2 of n-$Ga_{0.5}Al_{0.5}As$, an undoped active layer 3 of $Ga_{0.86}Al_{0.14}As$, a cladding layer 4 of p-$Ga_{0.5}Al_{0.5}As$, a super lattic layer 20 having alternate lamination of thirty layers in total including 50 Å thick undoped $Ga_{0.9}Al_{0.1}As$ well layers and 100 Å thick undoped $Ga_{0.3}Al_{0.7}As$ barrier layers, and an undoped GaAs cap layer 22 were successively grown on a substrate 1 of n-GaAs through MOCVD process. Subsequently, the cap layer 22 was subjected to Si ion implantation reaching the p-$Ga_{0.5}Al_{0.5}As$ cladding layer 4 to form a pattern of stripes 21 of 4 μm width. The stripes amounted in number to four near the facets and two in the center region of the laser, and had a center to center spacing of 8 μm. The length of the two-stripe center region was 100 μm. Thereafter, a positive electrode 8 and a negative electrode 9 were formed and then a laser device having a length of resonator of about 300 μm was prepared by cleaving. In this embodiment, current was permitted to flow through regions immediately underlying the Si implanted regions 21 for the reason as below. The super lattice layer is disordered and alloyed within the Si implanted regions. These disordered portions of the super lattice layer have a smaller refractive index than that of the remaining portions of the super lattice layer which are not disordered. Accordingly, the current prevails in the regions of smaller refractive index and, as the result, phases of the refractive index distribution and gain distribution became opposite to each other. Since, in this embodiment, the number of the stripes was changed along the direction of stripes, the selection of a fundamental supermode was eminent.

For a wavelength of 780 nm, the fabricated semiconductor laser was able to continuously oscillate with a threshold current of 90 to 130 mA at room temperature and to exhibit an oscillation spectrum of single longitudinal mode, having a far-field pattern of single lobe and a half width of 2.0°×25°. Thus, this structure was able to oscillate only in the fundamental supermode and to provide a stable transverse mode even with a maximum optical output of 300 mW. In pulse operation, only the fundamental supermode was able to oscillate even with a maximum optical output of 1 W. In addition, at 50° C., this laser was operated with a constant optical output of 300 mW for 2000 hours without remarkable degradation to evidence its long life and high reliability.

In the stripe structure in each of the foregoing embodiments of the invention, it has been confirmed that the number of the stripes may be 2 to 30 near the facets and 1 to 18 in the center region of the laser, the stripe width may be 1 to 10 μm, the center to center spacing between adjacent stripes may be 2 to 12 μm, the length of the region in which the number of stripes is reduced may be 5 to 200 μm, and the above dimensional values may be used in any combinations to attain similar effects to those described previously.

Figure 6:
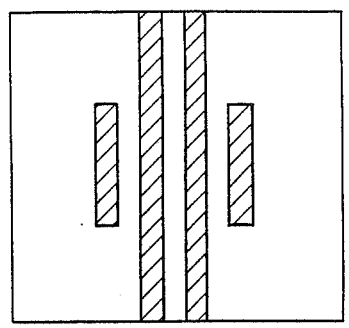

FIG. 6 shows a modified embodiment of the invention wherein the center region of a laser has a larger number of stripes than the neighborhood of mirror facets of the laser. Provably, this modification attained similar effects.

Embodiment 5

Figure 7A:
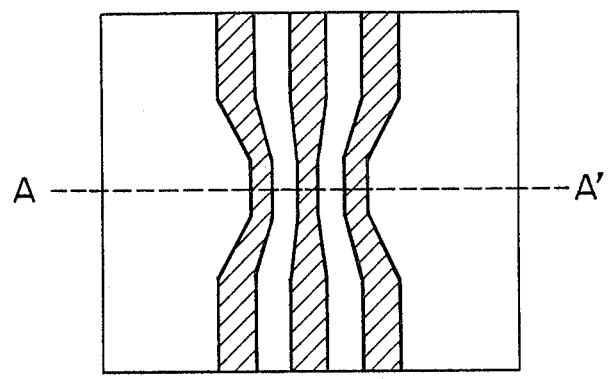
Figure 7B:
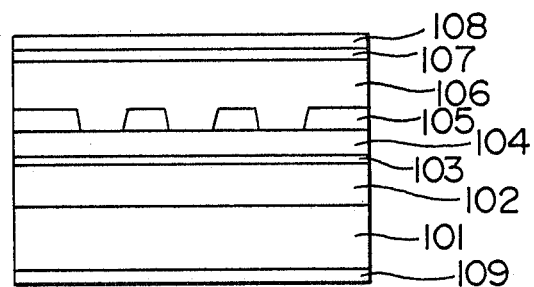

As noted above, teachings of the present invention is applicable to GaAlAs system lasers. FIG. 7a is a top view showing a GaAlAs system semiconductor laser according to a further embodiment of the invention, and FIG. 7b is a sectional view taken on the line A-A' of FIG. 7a.

A cladding layer 102 of n-$Ga_{0.5}Al_{0.5}As$, an undoped active layer 103 of $Ga_{0.86}Al_{0.14}As$, a cladding layer 104 of p-$Ga_{0.5}Al_{0.5}As$, and a current blocking layer 105 of n-GaAs were grown successively on a crystalline substrate 101 of n-GaAs through MOCVD process. The overall depth of part of the n-GaAs layer 105 was removed by photoetching to form three grooved stripes which exposed corresponding surface portions of the p-$Ga_{0.5}Al_{0.5}As$ cladding layer 104. Near the mirror facets of the laser, the width of stripe was 4 μm and the center to center pitch between adjacent stripes was 7 μm, and in the center region of the laser, the stripe width was 1 μm and the center to center spacing was 2 μm. The length of the center region was 50 μm and the length of a tapered stripe portion at the boundary between the facet and center region was 50 μm. Subsequently, a cladding layer 106 of p-$Ga_{0.5}Al_{0.5}As$ and a cap layer 107 of p-GaAs were successively formed through MOCVD process. Thereafter, a positive electrode 108 and a negative electrode 109 were formed and then a laser device having a length of resonator of about 300 μm was prepared by cleaving. In this embodiment, the thickness of the p-$Ga_{0.5}Al_{0.5}As$ cladding layer 104 was 0.1 to 0.5 μm and under this condition, the device became an index-guided waveguide which realized a phased array laser of low astigmatism and high output.

The whole stripe width in the laser center region was 5 μm, and a higher order super mode is not allowed to pass through the center region, thus failing to oscillate.

For a wavelength of 780 nm, the fabricated semiconductor laser was able to continuously oscillate with a threshold current of 80 to 100 mA at room temperature and to exhibit an oscillation spectrum of single longitudinal mode, having a far-field pattern of single lobe and a half width of 2.3°×25°. Thus, this structure was able to oscillate only in a fundamental supermode and to provide a stable transverse mode even with a maximum optical output of 300 mW. In addition, at 50° C., this laser was operated with a constant optical output of 300 mW for 2000 hours without remarkable degradation to evidence its long life and high reliability.

Embodiment 6

Figure 8A:
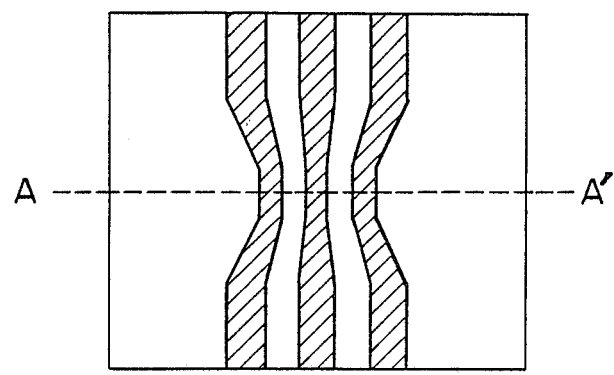
Figure 8B:
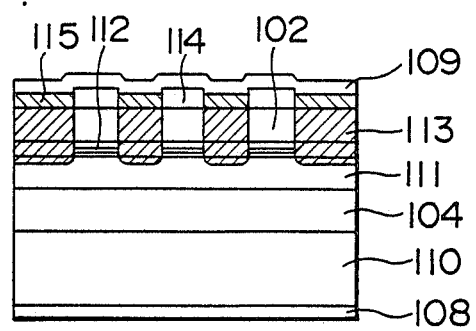

A still further embodiment of the invention directed to a different type from the embodiment 5 will now be described. FIG. 8a is a top view of a laser according to this embodiment and FIG. 86 is a sectional view taken on the line A-A' of FIG. 8a.

A cladding layer 104 of p-$Ga_{0.5}Al_{0.5}As$, an optical guide layer 111 of p-$Ga_{0.6}Al_{0.4}As$, a multiquantum well active layer 112 in the form of a super lattice structure having alternate lamination of five 70 Å A thick $Ga_{0.92}Al_{0.08}As$ well layers and five 40 Å thick $Ga_{0.72}Al_{0.28}As$ barrier layers, a cladding layer 102 of n-$Ga_{0.5}Al_{0.5}As$, and a cap layer 114 of n-GaAs were grown successively on a substrate 110 of p-GaAs through MOCVD process. Subsequently, the n-GaAs cap layer 114 was patterned through photoetching to form three stripes and the remaining portions of the cap layer 114 were subjected to ion implantation of Si reaching the active layer 112, thereby forming disordered and alloyed layers 113. In this embodiment, near the mirror facets of the laser, the stripe width was 3 μm and the center to center pitch between adjacent stripes was 6 μm, and in the center region of the laser, the stripe width was 1.5 μm and the stripe center to center spacing was 3.0 μm. The length of the center region was 30 μm and the length of a tapered stripe portion at the boundary between the facet and center region was 70 μm. Thereafter, an $SiO_2$ film 115 was deposited on the n-GaAs cap layer 114 excepting the stripe pattern and then a positive electrode 108 and a negative electrode 109 were formed. Finally, a laser device having a length of resonator of about 300 μm was prepared by cleaving. The thus fabricated semiconductor laser had, in the laser center region, the whole stripe width which was 7.5 μm and incompatible with the higher order mode cut-off conditions, but was able to exhibit substantially the same characteristics as those of the embodiment 5 and to oscillate only in a fundamental supermode.

Embodiment 7

Figure 9A:
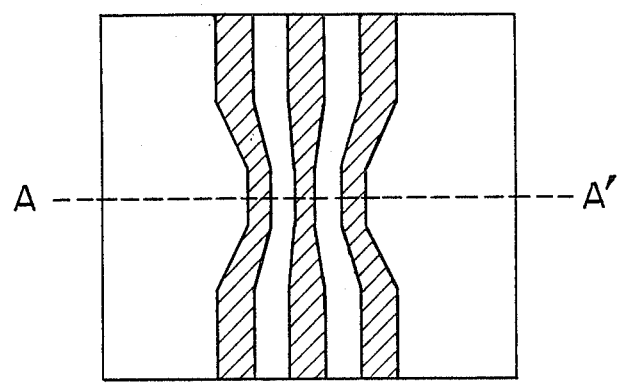
Figure 9B:
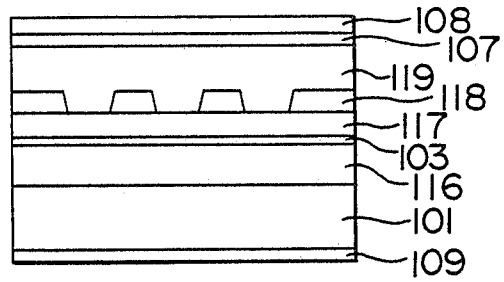

FIG. 9a is a top view of a laser according to a still further embodiment of the invention, and FIG. 9b is a sectional view taken on the line A-A' of FIG. 9a.

A cladding layer 116 of n-$Ga_{0.45}Al_{0.55}As$, an undoped active layer 103 of $Ga_{0.86}Al_{0.14}As$, a cladding layer 117 of p-$Ga_{0.55}Al_{0.45}As$, and a current blocking layer 118 of n-$Ga_{0.45}Al_{0.55}As$ were grown on a crystalline substrate 101 of n-GaAs through MOCVD process. The overall depth of part of the n-$Ga_{0.45}Al_{0.55}As$ layer 118 was removed by photoetching to form three stripes which exposed corresponding surface portions of the p-$Ga_{0.55}Al_{0.45}As$ cladding layer 117. Near the mirror facets of the laser, the stripe width was 4 μm and the center to center spacing between adjacent stripes was 7 μm, and in the center region of the laser, the stripe width was 1 μm and the center to center spacing between adjacent stripes was 2 μm. The length of the center region was 50 μm and the length of a tapered portion at the boundary between the facet and center region was 60 μm.

Subsequently, a cladding layer 119 of p-$Ga_{0.55}Al_{0.45}As$ and a cap layer 107 of p-GaAs were successively formed through MOCVD process. Thereafter, a positive electrode 108 and a negative electrode 109 were formed and then a laser device having a length of resonator of about 300 μm was prepared by cleaving. In this embodiment, the thickness of the p-$Ga_{0.55}Al_{0.45}As$ cladding layer 117 was 0.1 to 0.5 μm and under this condition, the device became an index-guided waveguide which realized a phased array laser of low astigmatism and high output. The fabricated laser exhibited substantially the same characteristics as those of the embodiment 5 and oscillated only in a fundamental supermode.

In the stripe structure in each of the foregoing embodiments 5, 6 and 7, it has been confirmed that the number of stripes may be 2 to 20, the stripe width may be 1.5 to 10 μm near the mirror facets of the laser and 1 to 5 μm in the laser center region (where the stripe width for the laser facet must be larger than that for the center region), the center to center spacing between adjacent stripes may be 2 to 12 μm near the laser facets and 1.5 to 10 μm in the laser center region, and the above dimensional values may be used in any combinations to attain similar effects.

Obviously, as the basic stripe structure of the present invention, a BH (buried hetero) structure, a rib waveguide structure and the like may alternatively be used as desired.

In addition to the laser for the wavelength of about 780 nm described in connection with the foregoing embodiments, a GaAlAs system semiconductor laser for a wavelength of 680 to 890 nm has been proven to attain similar effects to those described previously within the overall range allowed for continuous oscillation at room temperature. In addition to the GaAlAs system material, various laser materials such as InGaAsP system material and InGaP system material may similarly be used for the semiconductor laser of the present invention. Further, the laser configuration is not limited to the structure based on three-layer waveguide as exemplified in connection with the foregoing embodiments but may also be an LOC (large optical cavity) structure having an optical guide layer contiguous to either side of an active layer, an SCH (separate confinement hetero) structure having optical guide layers contiguous to both sides of an active layer, or a GRIN-SCH (graded-index-separate confinement hetero) structure wherein refractive index and forbidden band width of the optical guide layer in the LOC and SCH structures are distributed in the direction of film thickness. Furthermore, the invention is effectively applicable to an active layer of quantum well structure. It has been proven that the conductivity type in the foregoing embodiments may be all inverted (p-conductivity type may be replaced with n-conductivity type and vice versa) without impairment of the effects described previously.

FIGS. 10 and 11 show further modified embodiments of the invention wherein the center region of a laser has a larger stripe width than the neighborhood of mirror facets of the laser. Probably, these modification attained similar effects.

We claim:

1. In a semiconductor laser having a substrate, an active layer on said substrate and a resonance cavity comprising:
    at least two or more laser luminous strips disposed in said resonance cavity in the direction of laser propagation along said cavity, said laser luminous strips having a higher refractive index than other regions of said laser, laser lights propagated through said strips being mutually coupled with each other; and
    at least one region wherein at least one of the number, the width and the spacing of said laser luminous stripes is varied,
    wherein optical loss to a higher order transverse supermode is increased, and only a fundamental transverse mode oscillates.

2. A semiconductor laser according to claim 1, wherein laser luminous stripes in a region in which the number of laser luminous stripes is minimized extend linearly in the longitudinal direction of stripes.

3. A semiconductor laser according to claim 1, wherein the number of said laser luminous tripes is larger near the mirror facets of said laser than in the center region of said laser.

4. A semiconductor laser according to claim 2, wherein the number of said laser luminous stripes is larger near the mirror facts of said laser than in the center region of said laser.

5. In a semiconductor laser having a substrate, an active layer on said substrate and a resonance cavity comprising:
    at least two or more laser luminous stripes disposed in said resonance cavity in the direction of laser propagation along said cavity, said laser luminous stripes having a higher refractive index than other regions of said laser, laser lights propagated through said stripes being mutually coupled with each other; and
    at least one region wherein the whole stripe width of said laser luminous stripes is varied.
    wherein optical loss to a higher order supermode is increased, and only a fundamental transverse mode oscillates.

6. A semiconductor laser according to claim 5, wherein the whole stripe width is larger near the mirror facets of said laser than in the center region.

7. A semiconductor laser according to claim 5, wherein the number of said laser luminous stripes is invariable in the longitudinal direction of stripes.

8. A semiconductor laser according to claim 6, wherein the number of said laser luminous stripes is invariable in the longitudinal direction of stripes.

9. A semiconductor laser comprising:
   a substrate;
   a first cladding layer formed on said substrate;
   an active layer formed on said first cladding layer;
   a second cladding layer formed on said active layer;
   a current blocking layer formed on said second cladding layer and made up of at least two stripes;
   a third cladding layer formed on said blocking layer and said second cladding layer exposed between said stripes of said blocking layer;
   a cap layer formed on said third cladding layer; and
   electrode layers formed on said cap layer and on said substrate opposite said first cladding layer,
   wherein at least one of the number, the width and the center to center spacing of said stripes is varied in at least one region of said laser,
   wherein optical loss to a higher order supermode is increased, and only a fundamental transverse mode oscillates.

10. A semiconductor laser according to claim 9, wherein the number of said stripes is varied such that there is a greater number of stripes near facets of said laser than in a center region of said laser.

11. A semiconductor laser according to claim 10, wherein the number of stripes near said facets of said laser is from 2 to 30, and the number of stripes in said center region of said laser is from 1 to 18.

12. A semiconductor laser according to claim 10, wherein said center region of said laser has a length of from 5 to 200 $\mu$m.

13. A semiconductor laser according to claim 9, wherein said stripes have a width of 1 to 10 $\mu$m.

14. A semiconductor laser according to claim 9, wherein said stripes have a center to center spacing of 2 to 12 $\mu$m.

15. A semiconductor laser according to claim 9, wherein the number of said stripes is varied such that there is a greater number of stripes in a center region of said laser than near facets of said laser.

16. A semiconductor laser according to claim 9, wherein the width and the center to center spacing of said stripes are varied such that said stripes near facets of said laser have a width and center to center spacing greater than said stripes in a center region of said laser.

17. A semiconductor laser according to claim 16, wherein
   the width of said stripes near said facets of said laser is from 1.5 to 10 $\mu$m and the center to center spacing of said stripes near said facets of said laser is from 2 to 12 $\mu$m; and
   the width of said stripes in said center region of said laser is from 1 to 5 $\mu$m and the center to center spacing of said stripes in said center region of said laser is from 1.5 to 10 $\mu$m.

18. A semiconductor laser according to claim 16, wherein a tapered portion of said stripes extends 50 to 60 $\mu$m between said stripes near said facets of said laser and said stripes in said center region of said laser.

19. A semiconductor laser according to claim 9, wherein the width and center to center spacing of said stripes is varied such that said stripes in a center region of said laser have a width and center to center spacing greater than said stripes near facets of said laser.

20. A semiconductor laser comprising:
   a substrate;
   a first cladding layer formed on said substrate;
   an optical guide layer formed on said first cladding layer;
   a multi-quantum well layer formed on said optical guide layer and made up of at least two stripes;
   disordered and alloyed layers formed on said optical guide layer exposed between said stripes;
   a SiO$_2$ film formed on said disordered and alloyed layers;
   a second cladding layer formed on said stripes;
   a cap layer formed on said second cladding layer; and
   electrode layers formed on said cap layer and said SiO$_2$ film and on said substrate opposite said first cladding layer,
   wherein at least one of the number, the width and the center to center spacing of said stripes is varied in at least one region of said laser,
   wherein optical loss to a higher order supermode is increased, and only a fundamental transverse mode oscillates.

21. A semiconductor laser according to claim 20, wherein the number of said stripes is varied such that there is a greater number of stripes near facets of said laser than in a center region of said laser.

22. A semiconductor laser according to claim 21, wherein the number of stripes near said facets of said laser is from 2 to 30, and the number of stripes in said center region of said laser is from 1 to 18.

23. A semiconductor laser according to claim 21 wherein said center region of said laser has a length of from 5 to 200 $\mu$m.

24. A semiconductor laser according to claim 20, wherein said stripes has a width of 1 to 10 $\mu$m.

25. A semiconductor laser according to claim 22, wherein said stripes have a center to center spacing of 21 to 12 $\mu$m.

26. A semiconductor laser according to claim 20, wherein the width and the center to center spacing of said stripes are varied such that said stripes near facets of said laser have a width and center to center spacing greater than said stripes in a center region of said laser.

27. A semiconductor laser according to claim 26, wherein
   the width of said stripes near said facets of said laser is from 1.5 to 10 $\mu$m and the center to center spacing of said stripes near said facets of said laser is from 2 to 12 $\mu$m; and
   the width of said stripes in said center region of said laser is from 1 to 5 $\mu$m and the center to center spacing of said stripes in said center region of said laser is from 1.5 to 10 $\mu$m.

28. A semiconductor laser according to claim 26, wherein a tapered portion of said stripes extends 50 to 60 $\mu$m between said stripes near said facets of said laser and said stripes in said center region of said laser.

29. A semiconductor laser according to claim 20, the width and the center to center spacing of said stripes is varied such that said stripes in a center region of said laser have a width and center to center spacing greater than said stripes near facets of said laser.

30. A semiconductor laser comprising:

a substrate;
a first cladding layer formed on said substrate; an undoped active layer formed on said first cladding layer; said undoped active
a second cladding layer formed on layer;
a superlattice layer formed on said second cladding layer and made up of at least two stripes;
a cap layer formed on said second cladding layer exposed between said stripes; and
electrode layers formed on said cap layer and said superlattice layer and on said substrate opposite said first cladding layer,
wherein at least one of the number, the width and the center to center spacing of said stripes is varied in at least one region of said laser,
wherein optical loss to a higher order supermode is increased, and only a fundamental transverse mode oscillates.

* * * * *